(12) United States Patent
Takasu (10) Patent No.: US 9,420,720 B2
(45) Date of Patent: Aug. 16, 2016

(54) LIQUID COOLING APPARATUS

(71) Applicant: FUJITSU LIMITED, Kawasaki-shi, Kanagawa (JP)

(72) Inventor: Yoichi Takasu, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 148 days.

(21) Appl. No.: 14/258,389

(22) Filed: Apr. 22, 2014

(65) Prior Publication Data

US 2014/0224456 A1 Aug. 14, 2014

Related U.S. Application Data

(63) Continuation of application No. PCT/JP2011/074584, filed on Oct. 25, 2011.

(51) Int. Cl.
*H05K 7/20* (2006.01)
*G06F 1/20* (2006.01)
*H01L 23/473* (2006.01)

(52) U.S. Cl.
CPC .............. *H05K 7/20218* (2013.01); *G06F 1/20* (2013.01); *H05K 7/20772* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| 4,884,167 A | 11/1989 | Mine |
| 5,550,710 A * | 8/1996 | Rahamim .............. G06F 1/1632 361/679.33 |

(Continued)

FOREIGN PATENT DOCUMENTS

| JP | 64-005045 A | 1/1989 |
| JP | H01-124300 | 5/1989 |

(Continued)

OTHER PUBLICATIONS

Office Action mailed on Jun. 9, 2015 issued with respect to the corresponding Japanese Patent Application No. 2013-540534, with partial translation.

(Continued)

*Primary Examiner* — Anthony Haughton
*Assistant Examiner* — Razmeen Gafur
(74) *Attorney, Agent, or Firm* — Kratz, Quintos & Hanson, LLP (57) ABSTRACT

A liquid cooling apparatus includes a plurality of system boards each having a first surface and a second surface opposite the first surface, each of the system boards having at least one electronic component mounted on the first surface, a cooling plate attached to the electronic component and having a pathway formed therein through which coolant flows, one or more heat conductive members penetrating through any given one of the system boards, and a heat dissipating member disposed on the second surface of any given one of the system boards and connected to the one or more heat conductive members, wherein an emissivity of the heat dissipating member is higher than an emissivity of the one or more heat conductive members.

22 Claims, 7 Drawing Sheets

(56) References Cited

U.S. PATENT DOCUMENTS

| | | | |
|---|---|---|---|
| 5,923,084 A | 7/1999 | Inoue | |
| 6,305,180 B1* | 10/2001 | Miller | H05K 7/20572 165/104.33 |
| 7,143,816 B1* | 12/2006 | Ghosh | H01L 23/473 165/104.28 |
| 7,907,406 B1* | 3/2011 | Campbell | H05K 7/202 165/104.33 |
| 7,969,736 B1* | 6/2011 | Iyengar | H01L 23/36 165/104.33 |
| 2002/0015287 A1* | 2/2002 | Shao | H05K 7/20727 361/695 |
| 2002/0113142 A1* | 8/2002 | Patel | H01L 23/4735 239/128 |
| 2004/0057211 A1 | 3/2004 | Kondo | |
| 2004/0060692 A1* | 4/2004 | Pfeifer | H02M 7/003 361/704 |
| 2005/0168949 A1* | 8/2005 | Tilton | H01L 23/4735 361/699 |
| 2006/0007656 A1* | 1/2006 | Symons | H01L 23/473 361/699 |
| 2006/0011326 A1* | 1/2006 | Yuval | F28D 1/0475 165/80.4 |
| 2006/0012963 A1* | 1/2006 | Nishimura | G02F 1/133385 361/714 |
| 2006/0232942 A1* | 10/2006 | Nakatsu | B60L 11/08 361/710 |
| 2007/0025089 A1* | 2/2007 | Hsu | H01L 23/467 361/719 |
| 2007/0188991 A1* | 8/2007 | Wilson | H01L 23/473 361/699 |
| 2007/0211426 A1* | 9/2007 | Clayton | H01L 23/473 361/689 |
| 2008/0062651 A1* | 3/2008 | Reis | C09K 5/041 361/710 |
| 2008/0264604 A1* | 10/2008 | Campbell | F28F 3/02 165/80.4 |
| 2009/0040731 A1* | 2/2009 | Jin | H01L 23/02 361/711 |
| 2009/0237883 A1* | 9/2009 | Wei | G06F 1/20 361/699 |
| 2009/0251857 A1* | 10/2009 | Legen | H01L 23/4093 361/689 |
| 2009/0277616 A1* | 11/2009 | Cipolla | F28D 15/0233 165/104.33 |
| 2009/0279246 A1* | 11/2009 | Nguyen | G06F 1/187 361/679.34 |
| 2010/0025010 A1* | 2/2010 | Cipolla | H01L 23/4093 165/47 |
| 2010/0085712 A1* | 4/2010 | Hrehor, Jr. | H05K 7/20254 361/699 |
| 2010/0103618 A1* | 4/2010 | Campbell | H05K 7/20772 361/699 |
| 2010/0142154 A1* | 6/2010 | Collet | H05K 7/20454 361/714 |
| 2010/0163210 A1 | 7/2010 | Kluge | |
| 2010/0182751 A1* | 7/2010 | Seow | H01L 23/367 361/703 |
| 2010/0252234 A1* | 10/2010 | Cambell | H01L 23/473 165/80.2 |
| 2011/0110041 A1* | 5/2011 | Wong | H05K 7/20445 361/697 |
| 2011/0188204 A1* | 8/2011 | Horiuchi | H01L 23/473 361/702 |
| 2011/0255237 A1* | 10/2011 | Doll | G06F 1/20 361/679.46 |
| 2013/0194745 A1* | 8/2013 | Meijer | G06F 1/20 361/679.47 |
| 2014/0118954 A1* | 5/2014 | Shi | H05K 7/2039 361/720 |
| 2014/0153193 A1* | 6/2014 | Engelhardt | F28D 15/00 361/720 |

FOREIGN PATENT DOCUMENTS

| | | |
|---|---|---|
| JP | 08204072 A | 8/1996 |
| JP | H09-55459 | 2/1997 |
| JP | H10-41444 | 2/1998 |
| JP | H10-127055 | 5/1998 |
| JP | 2001-148593 A1 | 5/2001 |
| JP | 2003-50645 A1 | 2/2003 |
| JP | 2003-60133 A1 | 2/2003 |
| JP | 2004-246615 A1 | 9/2004 |
| JP | 2008-294196 A1 | 12/2008 |
| JP | 2009-79854 A1 | 4/2009 |
| JP | 2010-526427 A1 | 7/2010 |
| JP | 3162593 U | 9/2010 |

OTHER PUBLICATIONS

Office Action mailed on Jan. 20, 2015 issued with respect to the corresponding Japanese Patent Application No. 2013-540534. Partial translated office action.

International Search Report for International Application No. PCT/JP2011/074584 dated Dec. 20, 2011.

* cited by examiner

COOLANT WATER TEMPERATURE  A<B<C<D

FIG.8B

COOLANT WATER TEMPERATURE  A>B>C>D

FIG.9

LIQUID COOLING APPARATUS

CROSS-REFERENCE TO RELATED APPLICATIONS

This application is a continuation application of International Application PCT/JP2011/074584 filed on Oct. 25, 2011 and designated the U.S., the entire contents of which are incorporated herein by reference.

FIELD

The disclosures herein relate to a liquid cooling apparatus for an electronic apparatus and a liquid cooling method.

BACKGROUND

A CPU embedded in an electronic apparatus such as a computer generates heat when operating. Temperature may rise to an excessive level unless the CPU is cooled. An increase in the temperature of the CPU affects the performance and service life of the computer. Cooling the CPU is thus desirable for the purpose of suppressing a temperature increase.

In a liquid cooled computer, a CPU (i.e., coolant distribution unit) serving as a liquid coolant circulating apparatus circulates coolant water to a cooling plate disposed on the CPU, thereby cooling the CPU by use of the coolant water.

In order to improve cooling ability for the purpose of cooling a CPU that generates a large amount of heat, the amount of coolant water may be increased, or the temperature of the coolant water may be decreased. However, increasing the amount of coolant water may cause erosion corrosion in the cooling plate and pipes, and may also increase load on the coolant water pump. Further, decreasing the temperature of coolant water may cause dew condensation on the cooling plate and pipes. Dew condensation on a system board may cause short-circuiting, and thus poses a risk of damaging the computer.

In consideration of the above, a cooling structure may be configured such that a thermally conductive rod provided on a cold plate having coolant pathways therein is pressed against an integrated, circuit by a spring force, thereby efficiently transmitting heat from the integrated circuit to the cold plate through the thermally conductive rod (see Japanese Laid-open Patent Publication No. H1-124300, for example).

Generally, a CPU is mounted on a substrate such as a system board. In a structure that cools a CPU by providing a cooling plate on the front surface of the system board, provision may be made such that a cooling plate is also provided on the back surface of the system board to cool the CPU from the back side thereof. Providing two cooling plates for a single system board entails the necessity to secure a sufficiently large space that can accommodate the additional cooling plate. This means a decrease in the number of system boards implemented in a single apparatus.

Further, the configuration in which the system board is placed between the two cooling plates poses a risk of being unable to perform maintenance work such as adjusting or replacing an electronic component or the like on the system board. Moreover, as inevitable consequences, the cost of the additional cooling plate serves to increase the cost of the system board or the electronic apparatus.

SUMMARY

According to an aspect of the embodiment, a liquid cooling apparatus includes a plurality of system boards each having a first surface and a second surface opposite the first surface, each of the system boards having at least one electronic component mounted on the first surface, a cooling plate attached to the electronic component and having a pathway formed therein through which coolant flows, one or more heat conductive members penetrating through any given one of the system boards, and a heat dissipating member disposed on the second surface of any given one of the system boards and connected to the one or more heat conductive members, wherein an emissivity of the heat dissipating member is higher than an emissivity of the one or more heat conductive members.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described with reference to the accompanying drawings.

Figure 1:
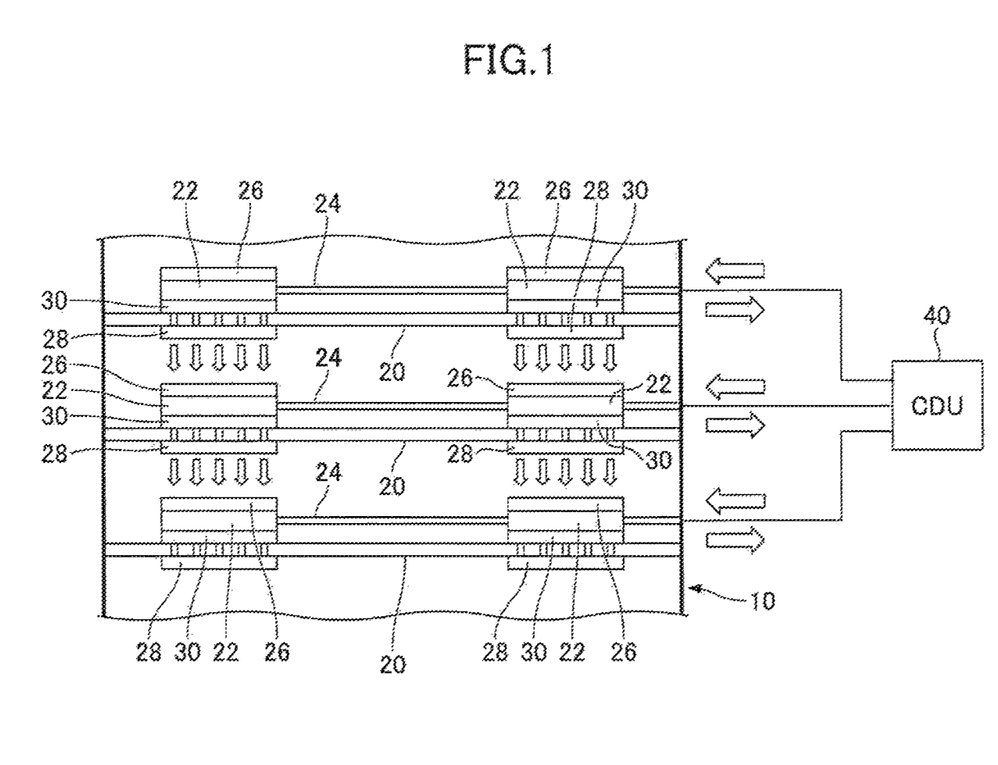
FIG. 1 is a schematic drawing illustrating a cooling apparatus according to a first embodiment.

FIG. 1 is a schematic drawing illustrating a cooling apparatus according to a first embodiment. FIG. 1 illustrates a portion of a computer rack 10 in which a plurality of system boards 20 are accommodated. The computer rack 10 is an electronic apparatus that may function as a server for communication equipment. The system boards 20 that are stacked one over another are accommodated in the computer rack 10 in a removable fashion. In the computer rack 10 illustrated in FIG. 1, the system boards 20 are stacked one over another in a vertical direction. Alternatively, the system boards 20 may be vertically oriented and arranged in a horizontal direction.

In FIG. 1, a plurality of electronic components 30 are mounted on a single system board 20. The electronic components 30 may each be a semiconductor device such as a CPU, and are heat generators that generate heat when operating. A cooling plate 22 that may be formed of copper (Cu) is disposed on each of the electronic components 30 mounted on the system board 20.

Figure 2:
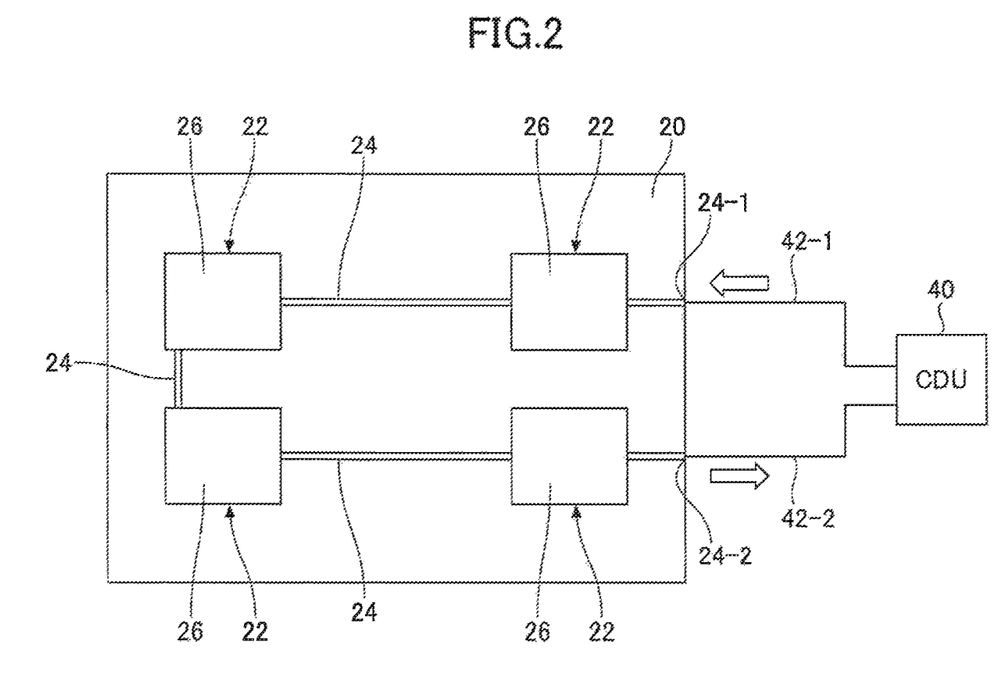
FIG. 2 is a plan view of a system board.

FIG. 2 is a plan view of a system board 20. Each cooling plate 22 has a pathway therein through which coolant water serving as coolant flows as will be described later. The cooling plates 22 attached to the electronic component 30 mounted on a system board is configured such that a pipe 24 forms a loop. Ends 24-1 and 24-2 of the pipe 24 are connected to pipes 42-2 and 42-2, respectively, which are in turn connected to a coolant distribution unit (i.e., CPU) 40. The CPU 40 supplies coolant water to the end 24-1 of the pipe 24 through the pipe 42-1. The coolant water flows through the pipe 24 to reach all the cooling plates 22 one after another, and flows from the end 24-2 through the pipe 42-2 to return to the CPU 40.

Figure 3:
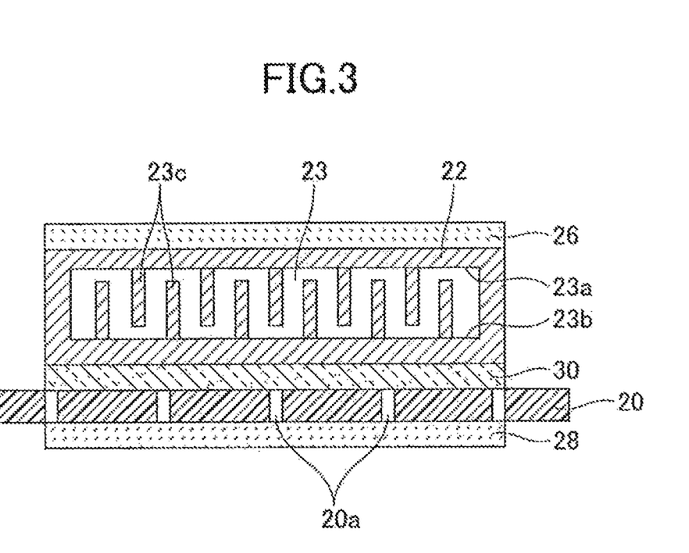
FIG. 3 is an enlarged cross-sectional view of the portion of the system board where an electronic component is mounted.

FIG. 3 is an enlarged cross-sectional view of the portion of the system board 20 where the electronic component 30 is mounted. The system board 20 is formed of a generally-available organic substrate material such as FR4. Electrodes of the electronic component 30 are connected to electrode pads (not shown) that are formed on a surface of the system board 20. The cooling plate 22 is fixed to an upper face of the electronic component 30 through heat-conductive adhesive agent or the like.

In the present embodiment, a heat absorption member 26 is attached on the cooling plate 22. The heat absorption member 26 may be made of a material having high emissivity such as ceramics, and is preferably porous. The function of the heat absorption member 26 will be described later. The material of the heat absorption member 26 may be ceramics having high emissivity such as alumina ($Al_2O_3$: emissivity=0.98), silicon carbide (SiC: emissivity=0.9), aluminum nitride (AlN: emissivity=0.93), or the like. Further, such material as zirconia (emissivity=0.95), silica (emissivity=8.5), graphite (emissivity 0.8), plastic (emissivity=0.95), or the like may also be used to form the heat absorption member 26. Alternatively, a metal or plastic material whose emissivity is increased by providing a coating on the surface thereof may be used as material for forming the heat absorption member 26. A surface of the heat absorption member 26, especially the surface that faces an adjacent system board 20, may preferably be black in order to increase emissivity (i.e., heat absorption rate).

As described above, the emissivity of the surface of the heat absorption member 26 is made higher than the emissivity of the surface of the cooling plate 22, thereby allowing the cooling plate 22 to absorb a larger amount of heat than otherwise.

The heat absorption member 26 is provided for the purpose of increasing the emissivity of the surface of the cooling plate 22. In the case of no such heat absorption member being provided, the surface of the cooling plate 22 may preferably be coated with an oxide film for increasing the emissivity of the surface. Alternatively, the surface of the cooling plate 22 may be made into a rough surface to increase the emissivity of the surface of the cooling plate 22. Also, the surface of the cooling plate 22 may be made black through a blackening process to increase the emissivity of the surface of the cooling plate 22.

In the present embodiment, heat conductive paths 20a serving as heat conductive members are formed in the system board 20 at the area where the electronic component 30 is mounted. Each of the heat conductive paths 20a is a cylindrical body formed of a high heat conductivity material such as metal material like copper (Cu), and penetrates through the system board 20 from the side where the electronic component 30 is disposed to the back side. Each of the heat conductive paths 20a serving as a heat conductive member may be a via formed in the system board 20, for example. It may be noted, however, that the heat conductive paths 20a are not supposed to function as electrical circuit wires in the system board 20. The heat conductive paths 20a are provided for the purpose of transferring part of the heat generated by the electronic component 30 to a heat dissipating member 28.

The heat dissipating member 28 is attached to the back surface of the system board 20, which is opposite the side where the electronic component 30 is mounted. The heat dissipating member 20 may be made of high emissivity material, such as ceramics, and is adhered to the end faces of the heat conductive paths through heat-conductive adhesive agent or the like. With this arrangement, part of the heat generated by the electronic component 30 is efficiently transmitted to the heat dissipating member 28 through the heat conductive paths 20a to be released from the heat dissipating member 28. The material of the heat dissipating member 28 may be the same material that is used for the heat absorption member 26. It may be noted, however, that the surface of the heat dissipating member 28 may be a smooth surface, rather than being porous, in order to ensure sufficient heat emissivity with respect to the surface of the neat dissipating member 28. The surface of the heat dissipating member 28 may preferably be made black in order to increase emissivity.

As described above, the emissivity of the heat dissipating member 28 is made higher than the emissivity of the heat conductive paths 20a serving as heat conductive members, so that a larger amount of heat than otherwise is released from the electronic component 30 through the heat conductive members and the heat dissipating member 28.

Referring to FIG. 3, the cooling plate 22 of the present embodiment has a pathway 23 formed therein through which coolant water flows. The pathway 23 has an upper wall 23a and a lower wall 23b, from both of which fins 23c extend toward inside the pathway 23. The fins 23c (first heat-sink fins) extending from the lower wall 23b are provided for the purpose of efficiently transferring heat generated by the electronic component 30 to coolant water flowing through the pathway 23. On the other hand, the fins 23c (second heat-sink fins) extending from the upper wall 23a are provided for the purpose of efficiently transferring heat absorbed by the heat absorption member 26 to coolant water flowing through the pathway 23. In the present embodiment, an arrangement is made such that the fins 23c (i.e., second heat-sink fins) extending from the upper wall 23a are provided.

In the configuration described above, the liquid cooling apparatus includes the cooling plates 22, the CDU 40, and the pipes 24, 42-1 and 42-2 connecting therebetween. Namely, cold coolant water with adjusted temperature, which is supplied from the CDU 40, flows through the pipe 42-1 to enter the pipe 24 through the end 24-1 of the pipe 24, and then flows successively through the pathways 23 of the cooling plates 22 that are disposed between the pipes 24. In so doing, the coolant water absorbs heat from the electronic components 30 disposed beneath the cooling plate 22 (i.e., cools the electronic components 30), which results in an increase in the temperature of the cooling water. The cooling water with an increased temperature flows into the pipe 42-2 through the end 24-2 of the pipe 24 to return to the CDU 40. The CDU 40 adjusts the temperature of the cooling water to generate cold cooling water, which is then sent out again to the pipe 42-1.

The liquid cooling apparatus of the present embodiment includes the heat absorption member 26 attached to the cooling plate 22, the heat conductive paths 20a formed in the system board 20, and the heat dissipating member 28 disposed on the back face of the system board.

In the following, a description will be made of the functions of the liquid cooling apparatus of the present embodiment by referring to FIG. 1.

The function to cool the electronic components 30 on the system board 20 through cooling plates 22 by use of cooling water supplied from the CDU 40 is as follows. In the present embodiment, heat emitted by the heat dissipating member 28 disposed on the system board 20 that is situated above the system board 20 of interest (e.g., the middle one of the three system boards 20 illustrated in FIG. 1) is received by the heat absorption member 26 attached to the cooling plate 22.

Namely, part of the heat generated by the electronic components 30 on the upper system board 20 propagates through the heat conductive, paths 20a of the upper system board 20 to be emitted from the heat dissipating members 28 of the upper system board 20. The heat absorption members 26 of the middle system board 20 absorb this heat. The heat absorbed by the heat absorption members 26 is transmitted to the cooling plates 22 of the middle system board 20, and are then absorbed by the cooling water flowing through the pathways 23 of these cooling plates 22. As a result, the heat absorption members 26 are kept at low temperature, thereby being able to efficiently absorb heat emitted from the heat dissipating members 28.

With the arrangement described above, the electronic components 30 on the upper system board 20 are not only cooled by the cooling plates 22 attached to these electronic components 30 but also cooled by the cooling plates 22 disposed on the middle system board 20. This arrangement enhances cooling performance with respect to the electronic components 30, which means that an increased amount of heat is removed from the electronic components 30 for resultant cooling. The same or similar cooling function is in existence between the middle system board 20 and the lower system board 20.

In the following, the amount of heat absorbed by the cooling plate 22 situated below the heat source will be analyzed. The amount of heat emitted by the heat dissipating member 28 is represented by the following formula (1).

$$P = \sigma \epsilon A (Ts^4 - Ta^4) \quad (1)$$

P: Amount of Emitted Heat (W)
$\sigma$: Stefan-Boltzmann's Constant ($5.67 \times 10^{-8}$ W/m$^2$K$^4$)
$\epsilon$: Emissivity
A: Emission Area (m$^2$)
Ts: Object Temperature (K)
Ta: Ambient Temperature (K)

Figure 4:
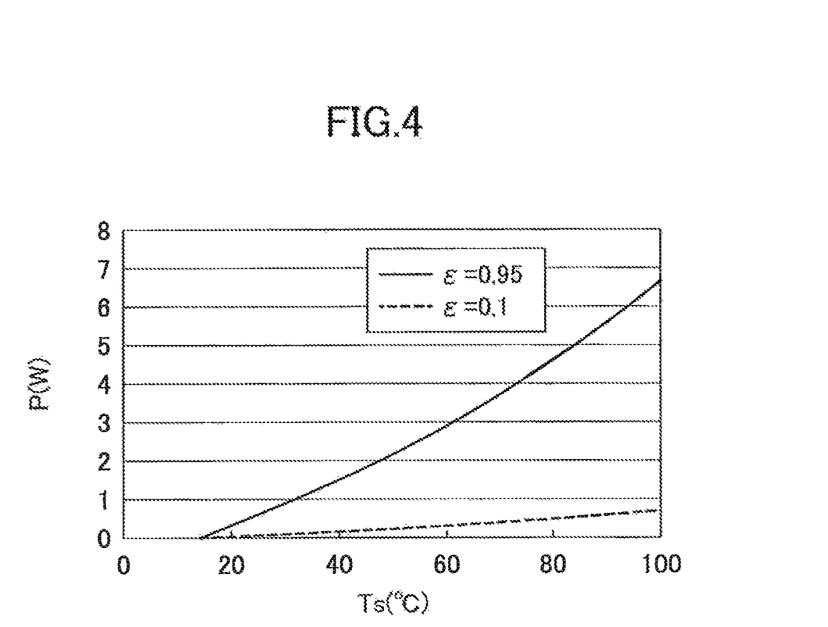
FIG. 4 is a drawing illustrating the relationship between the amount of heat emitted from a heat dissipating member and the emissivity of the heat dissipating member.

Ts (object temperature) represents the temperature of the back surface of the board. Ta (ambient temperature) represent the temperature of water (i.e., the temperature of the cooling plate). In the case of Ta (i.e., water temperature) being 15 degrees Celsius, the relationship between P (i.e., emitted heat amount) and Ts (i.e., temperature of the board back surface) is represented as illustrated in FIG. 4. In FIG. 4, $\epsilon$ (i.e., emissivity) is equal to 0.95 when a ceramic surface is used, and is equal to 0.1 when a metal surface (i.e., gloss surface) is used. The emission area A is 0.1 m$^2$. With the use of ceramic having $\epsilon$ equal to 0.95, the amount of heat equal to 3 to 4 W is emitted when the temperature of the back surface of the board is 60 to 70 degrees Celsius. Almost all the emitted heat is absorbed by the cooling plate 22 of the system board 20 situated below. Other system boards 20 do not absorb this heat, and thus do not exhibit an increase in temperature.

As described heretofore, the present embodiment can suppress a temperature increase in the electronic components 30, and ensures that emitted heat is efficiently absorbed by the cooling plate 22, thereby preventing a rise in ambient temperature and the temperature of other system boards. In the present embodiment, only the heat absorption member 26 and the heat dissipating member 28 made of ceramic are disposed on the upper face of the cooling plate 22 and the back face of the system board 20, respectively. Accordingly, the space required for accommodating the system board 20 and the weight and cost of the system board 20 are substantially the same as a conventional system board. Further, the back surface of the system board 20 is not in physical contact with the upper face of the cooling plate 22. This arrangement ensures easy, separate replacement of each one of the system boards 20, without presenting any maintenance difficulties.

With the arrangement described heretofore, no cooling plate 22 is in existence below the lowermost system board 20, so that there is a risk of having an insufficient ability to cool the lowermost system board 20. It is thus preferable to dispose a dummy board (not illustrated) having only the cooling plates 22 below the lowermost system board 20.

Figure 5:
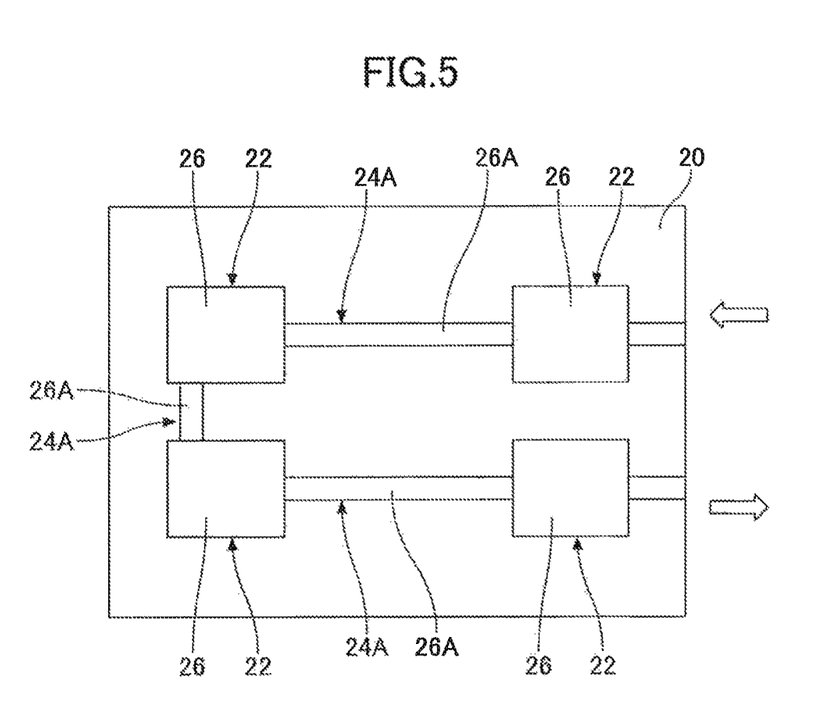
FIG. 5 is a plan view of the system board for which the shape of pipes is modified.

In the following, a description will be given of a variation of the pipes used in the liquid cooling system with reference to FIG. 5 and FIG. 6. FIG. 5 is a plan view of the system board for which the shape of the pipes is modified.

Figure 6:
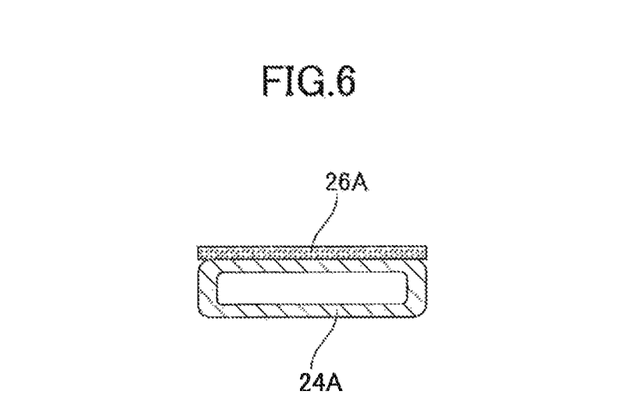
FIG. 6 is a cross-sectional view of the pipe illustrated in FIG. 5.

The pipe 24A illustrated in FIG. 5 has a flattened cross-sectional shape as illustrated in FIG. 6 as opposed to the pipe 24 illustrated in FIG. 2. The pipe on the system board 20 are not cylindrical, but are of planar shape as illustrated in FIG. 6, with a heat absorption member 26A disposed on the upper face of the pipe 24A. With this arrangement, the pipe 24A efficiently absorbs heat emitted from the system board 20 situated above, thereby preventing heat dissipation to other system boards 20.

In the configuration described above, the emissivity of the surface of the heat absorption member 26A is made higher than the emissivity of the surface of the pipe 24A, thereby allowing the pipe 24A to absorb a larger amount of heat than otherwise.

Figure 7:
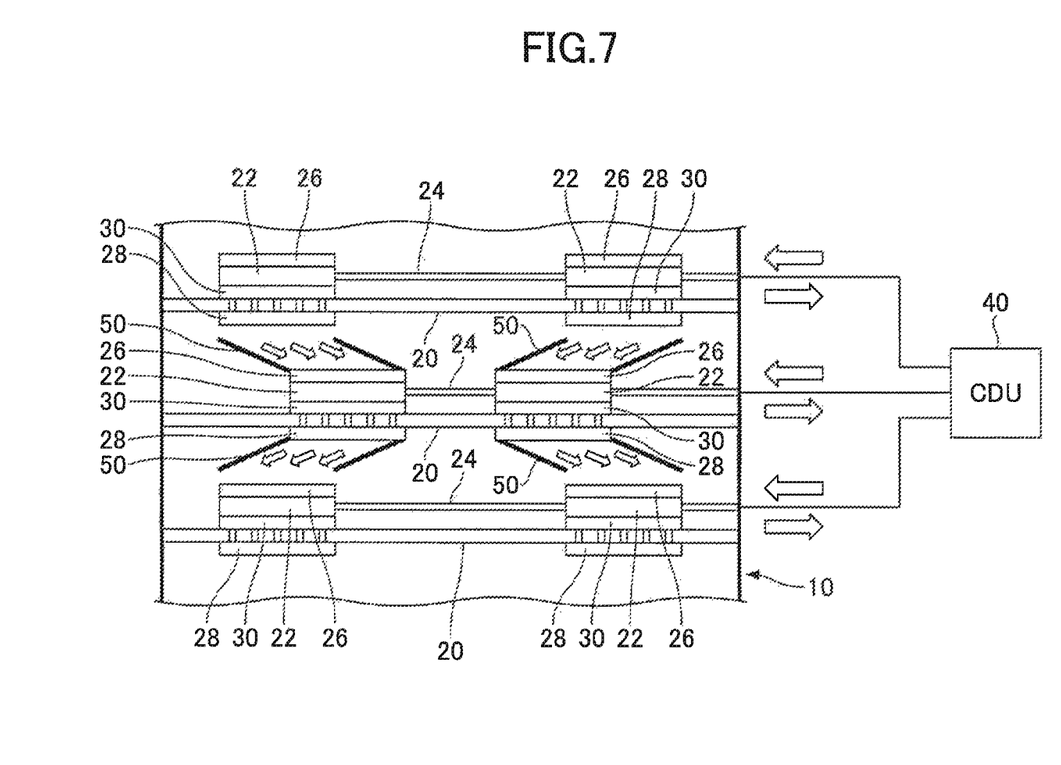
FIG. 7 is a schematic drawing illustrating a cooling apparatus according to a second embodiment.

In the following, a second embodiment will be described. FIG. 7 is a schematic drawing illustrating a cooling system according to the second embodiment. In FIG. 7, the same or similar elements as those of FIG. 1 are referred to by the same numerals, and a description thereof will be omitted as appropriate.

In the second embodiment, the electronic components 30 disposed on a given system board 20 are situated at different horizontal positions than the electronic components 30 disposed on another system board 20. In this case, the cooling plates 22 of the middle system board 20, for example, do not have, immediately thereabove, the heat dissipating members 28 of the upper system board 20. That is, there is positional discrepancy. In this state, the heat absorption members 26 of the middle system board 20 cannot absorb all the heat emitted from the heat dissipating members 28 of the upper system board 20. Significant portion of the heat emitted from these heat dissipating members 28 ends up being absorbed other system boards 20.

In consideration of the above, the present embodiment is configured such that guide members 50 are provided between the heat dissipating members 28 of the upper system board 20 and the heat absorption members 26 of the middle system board 20, and guide the heat emitted from the heat dissipating members 28 to the heat absorption members 26. Each of the guide members 50 may be a frame shape member made of metal such as aluminum or copper. The guide member 50 is disposed in such a manner as to enclose the space between the heat dissipating member 23 and the heat absorption member 26. With this arrangement, almost all the heat emitted from the heat dissipating member 20 propagates toward the direction of the heat absorption member 26 while being reflected by the interior surfaces (i.e., metal surfaces) of the guide member 50, thereby being absorbed by the heat absorption member 26. The guide members 50 do not have to be made of metal. Any material may be used as long as the interior surfaces can efficiently reflect emitted heat. For example, the guide member 50 may be made by coating with metal the interior surfaces of a resin member having a frame shape.

The guide member 50 is attached to the heat absorption member 26. There is a small gap between the guide member 50 and the heat dissipating member 28 or between the guide member 50 and the upper system board 20. Because of this, when the system board 20 is inserted or removed, the guide members 50 that are attached to the system board 20 are inserted or removed together with the system board 20. Each of the system boards 20 can thus be easily inserted or removed separately from each other as in the conventional configuration.

In the present embodiment, the guide members 50 are used to guide emitted heat under the circumstances in which the electronic components 30 disposed on a given system board 20 are situated at different horizontal positions than the electronic components 30 disposed on another system board 20. However, such guide members may also be employed in the first embodiment illustrated in FIG. 1. In such a case, emitted heat that would otherwise dissipate into ambient atmosphere is reflected by the interior surfaces of the guide member 50, and is thus efficiently absorbed by the heat absorption member 26.

In the following, a description will be given of an example of a cooling method using the apparatus of the embodiments heretofore described.

Figure 8A:
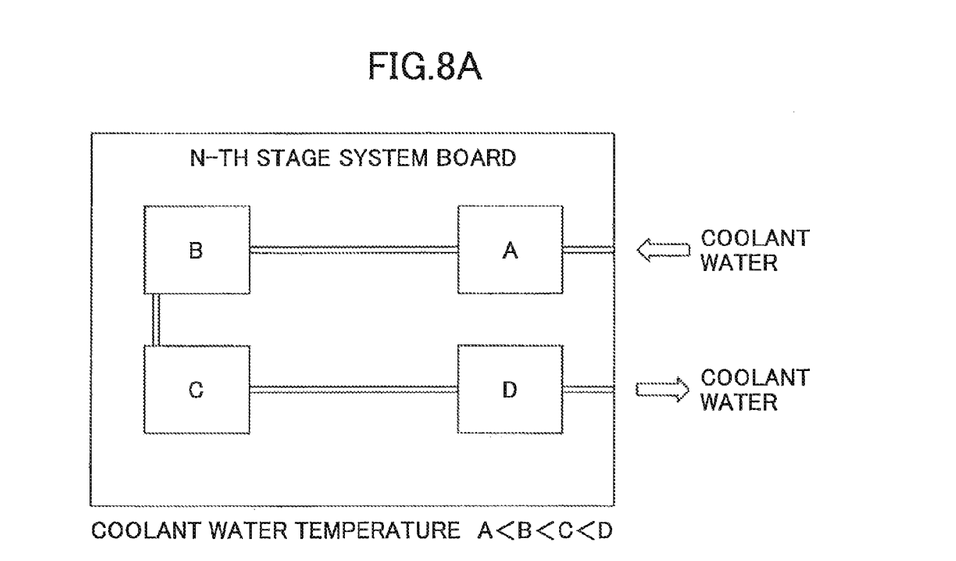
FIGS. 8A and 8B are drawings for explaining an example of a cooling method.
Figure 8B:
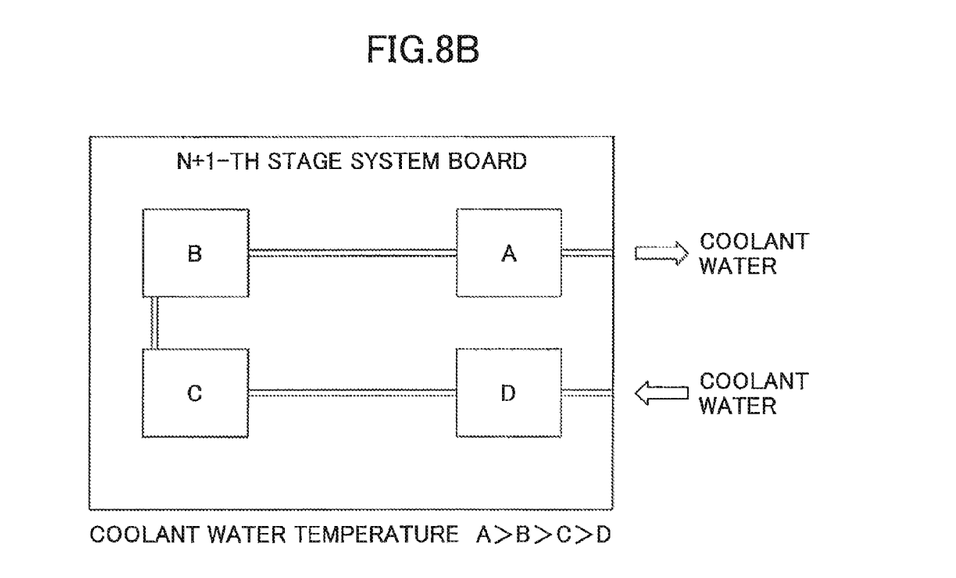

When cooling the electronic components 30 disposed on the system board 20, coolant water is relatively cold upstream and relatively hot downstream, resulting in differences in temperature between the electronic components 30. Differences in the temperatures of electronic components 30 result in differences in performance and differences in the length of service life. In order to suppress such differences in temperature, the direction of coolant water flow supplied from the CDU 40 is alternated between adjacent system boards 20 as illustrated in FIGS. 8A and 8B. When the system boards 20 are stacked one over another, for example, coolant water is circulated on the n-th stage system board 20 in the following sequence of cooling plates: A, B, C and D whereas coolant water is circulated on the n+1-th stage system board 20 in the following sequence of cooling plates: D, C, B and A. With this arrangement, the temperature of coolant water in the cooling plates 22 on the n-th stage system board 20 is A<B<C<D whereas the temperature of coolant water in the cooling plates 22 on the n+1-th stage system board 20 is D<C<B<A.

Figure 9:
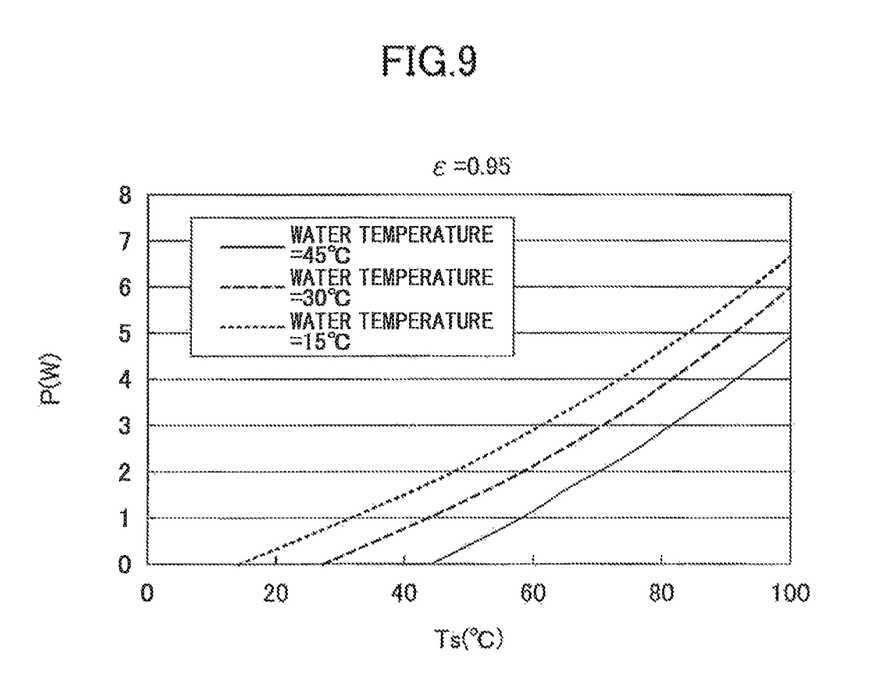
FIG. 9 is a drawing illustrating the relationship between the amount of emitted heat and the temperature of coolant water.

The relationship between the temperature of the back surface of the system board 20 and the amount of emitted heat is dependent on the temperature of coolant water as illustrated in FIG. 9. The cooling plate D of the n-th stage system board 20 has a high water temperature, so that the temperature of the electronic component 30 is also high, which results in the temperature of the back surface of the system board 20 being also high. However, the cooling plate D of the n+1-th system board 20 situated below has a relatively low water temperature, so that the n-th system board 20 at the position of the cooling plate D emits a greater amount of heat than otherwise. Accordingly, differences in the temperatures of the electronic components 30 on the system board are in a tendency to disappear.

According to an embodiment, the provision of a heat dissipating member and a heat absorption member, without an additional cooling plate, improves cooling performance with respect electronic components.

The cooling apparatus described heretofore may be employed for the purpose of cooling an electronic apparatus.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A liquid cooling apparatus, comprising:
   a plurality of system boards each having a first surface and a second surface opposite the first surface, each of the system boards being a flat plate, and each of the system boards having at least one electronic component mounted on the first surface;
   a cooling plate attached to the electronic component and having a pathway formed therein through which coolant flows;
   one or more heat conductive members penetrating through any given one of the system boards that is a flat plate; and
   a heat dissipating member disposed on the second surface of any given one of the system boards and connected to the one or more heat conductive members,
   wherein an emissivity of the heat dissipating member is higher than an emissivity of the one or more heat conductive members.

2. The liquid cooling apparatus as claimed in claim 1, further comprising a heat absorption member disposed on the cooling plate, wherein an emissivity of a surface of the heat absorption member is higher than a surface of the cooling plate.

3. The liquid cooling apparatus as claimed in claim 2, wherein the heat dissipating member of one of the system boards and the heat absorption member of a next lower one of the system boards are situated to face each other.

4. The liquid cooling apparatus as claimed in claim 1, wherein the one or more heat conductive members are in contact with the electronic component and the heat dissipating member.

5. The liquid cooling apparatus as claimed in claim 2, wherein the heat absorption member is made of a ceramic porous body.

6. The liquid cooling apparatus as claimed in claim 2, wherein the heat dissipating member is made of ceramic, and has a smooth, flat surface.

7. The liquid cooling apparatus as claimed in claim 2, wherein a surface of the heat dissipating member and the surface of the heat absorption member are black.

8. The liquid cooling apparatus as claimed in claim 1, wherein a surface of the cooling plate and a face of the one or more heat conductive members situated on the same side as the second surface are coated with an oxide film.

9. The liquid cooling apparatus as claimed in claim 1, wherein a surface of the cooling plate and a face of the one or more heat conductive members situated on the same side as the second surface are rough surfaces.

10. The liquid cooling apparatus as claimed in claim 1, wherein a surface of the cooling plate and a face of the one or more heat conductive members situated on the same side as the second surface are black.

11. The liquid cooling apparatus as claimed in claim 1, further comprising:
   a pipe connected to the cooling plate and having a planar cross-sectional shape; and
   a pipe heat absorption member having an emissivity higher than an emissivity of a surface of the pipe and disposed on the surface of the pipe.

12. The liquid cooling apparatus as claimed in claim 11, wherein the pipe heat absorption member has a black surface.

13. The liquid cooling apparatus as claimed in claim 1, further comprising a pipe connected to the cooling plate and having a planar cross-sectional shape, the pipe having a surface that is coated with an oxide film.

14. The liquid cooling apparatus as claimed in claim 1, further comprising a pipe connected to the cooling plate and having a planar cross-sectional shape, the pipe having a rough surface.

15. The liquid cooling apparatus as claimed in claim 13, wherein the pipe has a black surface.

16. The liquid cooling apparatus as claimed in claim 1, further comprising:
   a first heat-sink fin extending from a first interior wall of the pathway, the first interior wall being situated on the same side of the pathway as the electronic component; and
   a second heat-sink fin extending from a second interior wall of the pathway, the second interior wall being situated on an opposite side of the pathway from the electronic component.

17. The liquid cooling apparatus as claimed in claim 1, further comprising a guide member configured to guide emitted heat between the heat dissipating member attached to the second surface of one of the system boards and a surface of the cooling plate of an adjacent one of the system boards.

18. The liquid cooling apparatus as claimed in claim 17, wherein the guide member has a frame shape that encloses space between the heat dissipating member and the cooling plate, and is fixedly attached to the cooling plate.

19. The liquid cooling apparatus as claimed in claim 17, wherein the guide member is made of metal, and has an interior face that is a gloss surface.

20. A cooling method for the liquid cooling apparatus of claim 1, comprising:
   circulating the coolant through cooling plates in a first direction on a first one of the system boards; and
   circulating the coolant through cooling plates in a second direction on a second one of the system boards adjacent to the first one of the system boards, the second direction being opposite the first direction.

21. The liquid cooling apparatus as claimed in claim 1, wherein the heat dissipating member is disposed on the second surface without an electronic component intervening therebetween.

22. The liquid cooling apparatus as claimed in claim 1, wherein the flat plate of each of the system boards has one or more penetrating holes penetrating therethrough in a thickness direction thereof, and the one or more heat conductive members extend through the one or more penetrating holes of the system boards.

* * * * *